United States Patent
Tung et al.

(10) Patent No.: US 9,647,227 B2
(45) Date of Patent: *May 9, 2017

(54) ORGANIC LIGHT EMITTING DEVICES

(71) Applicant: Universal Display Corporation, Ewing, NJ (US)

(72) Inventors: Yeh-Jiun Tung, Princeton, NJ (US); Michael S. Weaver, Princeton, NJ (US); Michael Hack, Lambertville, NJ (US); James R. Esler, Levittown, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,065

(22) Filed: May 29, 2015

(65) Prior Publication Data
US 2015/0303395 A1  Oct. 22, 2015

Related U.S. Application Data

(63) Continuation of application No. 11/105,666, filed on Apr. 13, 2005, now Pat. No. 9,070,884.

(51) Int. Cl.
| | |
|---|---|
| H01L 51/54 | (2006.01) |
| H01L 51/50 | (2006.01) |
| C09K 11/06 | (2006.01) |
| H01L 51/00 | (2006.01) |
| H05B 33/14 | (2006.01) |
| H01L 51/52 | (2006.01) |
| H01L 27/32 | (2006.01) |

(52) U.S. Cl.
CPC .......... *H01L 51/5044* (2013.01); *C09K 11/06* (2013.01); *H01L 51/0054* (2013.01); *H01L 51/0058* (2013.01); *H01L 51/504* (2013.01); *H01L 51/5016* (2013.01); *H01L 51/5056* (2013.01); *H01L 51/5278* (2013.01); *H05B 33/14* (2013.01); *C09K 2211/1011* (2013.01); *H01L 27/3209* (2013.01); *H01L 51/006* (2013.01); *H01L 51/0052* (2013.01); *H01L 51/0071* (2013.01); *H01L 51/0081* (2013.01); *H01L 51/0085* (2013.01); *H01L 2251/5376* (2013.01)

(58) Field of Classification Search
CPC . C09K 11/06; C09K 2211/00; C09K 2211/10; C09K 2211/1003; C09K 2211/1011; H05B 33/14; H01L 27/32; H01L 27/3206; H01L 27/3209; H01L 51/0032; H01L 51/005; H01L 51/0051; H01L 51/0052; H01L 51/0053; H01L 51/0054; H01L 51/0058; H01L 51/006; H01L 51/0059; H01L 51/0071; H01L 51/0072; H01L 51/0081; H01L 51/0085; H01L 51/50; H01L 51/5012; H01L 51/5016; H01L 51/504; H01L 51/5044; H01L 51/5056; H01L 51/5278; H01L 2251/50; H01L 2251/53; H01L 2251/5376
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,121,029 | A | 6/1992 | Hosokawa et al. |
| 5,130,603 | A | 7/1992 | Tokailin et al. |
| 5,231,329 | A | 7/1993 | Nishikitani et al. |
| 5,247,190 | A | 9/1993 | Friend et al. |
| 5,540,999 | A | 7/1996 | Yamamoto et al. |
| 5,703,436 | A | 12/1997 | Forrest et al. |
| 5,707,745 | A | 1/1998 | Forrest et al. |
| 5,721,160 | A | 2/1998 | Forrest et al. |
| 5,756,224 | A | 5/1998 | Borner et al. |
| 5,757,026 | A | 5/1998 | Forrest et al. |
| 5,757,139 | A | 5/1998 | Forrest et al. |
| 5,786,879 | A | 7/1998 | Kodera et al. |
| 5,811,833 | A | 9/1998 | Thompson |
| 5,834,893 | A | 11/1998 | Bulovic et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Bansal, et al., Ukrainian Journal of Physics, (2007), vol. 52, No. 4, pp. 353-358.

(Continued)

*Primary Examiner* — Andrew K Bohaty
(74) *Attorney, Agent, or Firm* — Duane Morris LLP

(57) ABSTRACT

The present invention provides an emissive region in organic light emitting devices having a combined emission from at least two emissive materials, a fluorescent blue emissive material and a phosphorescent emissive material. The emissive region may further comprise additional fluorescent or phosphorescent emissive materials. Preferably, the emissive region has three different emissive materials—a red emissive material, a green emissive material and a blue emissive material. Organic light emitting devices incorporating the emissive region provides a high color-stability of the light emission over a wide range of currents or luminances.

19 Claims, 10 Drawing Sheets

(56) References Cited

U.S. PATENT DOCUMENTS

| | | | |
|---|---|---|---|
| 5,837,391 A | 11/1998 | Utsugi | |
| 5,844,363 A | 12/1998 | Gu et al. | |
| 5,861,219 A | 1/1999 | Thompson et al. | |
| 5,874,803 A | 2/1999 | Garbuzov et al. | |
| 5,917,280 A | 6/1999 | Burrows et al. | |
| 5,922,396 A | 7/1999 | Thompson | |
| 5,932,895 A | 8/1999 | Shen et al. | |
| 5,953,587 A | 9/1999 | Forrest et al. | |
| 5,981,306 A | 11/1999 | Burrows et al. | |
| 5,986,268 A | 11/1999 | Forrest et al. | |
| 5,986,401 A | 11/1999 | Thompson et al. | |
| 5,998,803 A | 12/1999 | Forrest et al. | |
| 6,005,252 A | 12/1999 | Forrest et al. | |
| 6,013,538 A | 1/2000 | Burrows et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,420,031 B1 | 7/2002 | Parthasarathy et al. | |
| 6,423,428 B1 | 7/2002 | Towns et al. | |
| 6,468,819 B1 | 10/2002 | Kim et al. | |
| 6,469,437 B1 | 10/2002 | Parthasarathy et al. | |
| 6,528,187 B1 | 3/2003 | Okada | |
| 6,548,956 B2 | 4/2003 | Forrest et al. | |
| 6,576,134 B1 | 6/2003 | Agner | |
| 6,580,213 B2 | 6/2003 | Yamazaki | |
| 6,602,540 B2 | 8/2003 | Gu et al. | |
| 6,628,068 B1 | 9/2003 | Rorison et al. | |
| 6,635,364 B1 | 10/2003 | Igarashi | |
| 6,687,266 B1 | 2/2004 | Ma et al. | |
| 6,830,828 B2 | 12/2004 | Thompson et al. | |
| 6,835,469 B2 | 12/2004 | Kwong et al. | |
| 6,863,997 B2 | 3/2005 | Thompson et al. | |
| 6,864,628 B2 | 3/2005 | Yamazaki et al. | |
| 6,867,538 B2 | 3/2005 | Adachi et al. | |
| 6,869,695 B2 | 3/2005 | Thompson et al. | |
| 6,872,472 B2 | 3/2005 | Liao et al. | |
| 6,921,915 B2 | 7/2005 | Takiguchi et al. | |
| 6,939,624 B2 | 9/2005 | Lamansky et al. | |
| 7,009,338 B2 | 3/2006 | D'Andrade et al. | |
| 7,071,615 B2 | 7/2006 | Lu et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,768,194 B2 | 8/2010 | Forrest et al. | |
| 9,070,884 B2* | 6/2015 | Tung | C09K 11/06 |
| 2001/0053462 A1 | 12/2001 | Mishima | |
| 2002/0027416 A1 | 3/2002 | Kim et al. | |
| 2002/0034656 A1 | 3/2002 | Thompson et al. | |
| 2002/0071963 A1 | 6/2002 | Fujii | |
| 2002/0134984 A1 | 9/2002 | Igarashi | |
| 2002/0158242 A1 | 10/2002 | Son et al. | |
| 2002/0182441 A1 | 12/2002 | Lamansky et al. | |
| 2002/0197511 A1 | 12/2002 | D'Andrade et al. | |
| 2003/0072964 A1 | 4/2003 | Kwong et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0104394 A1 | 6/2004 | Lin et al. | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2004/0183082 A1 | 9/2004 | Yamazaki | |
| 2004/0195965 A1 | 10/2004 | Yamazaki et al. | |
| 2005/0025993 A1 | 2/2005 | Thompson et al. | |
| 2005/0077817 A1* | 4/2005 | Yamazaki | H01L 51/5016 313/504 |
| 2005/0112407 A1 | 5/2005 | Ogasawara et al. | |
| 2005/0164033 A1 | 7/2005 | Chin et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0134460 A1* | 6/2006 | Kondakova | C09K 11/06 428/690 |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2014/0326972 A1* | 11/2014 | Forrest | H01L 51/5016 257/40 |

FOREIGN PATENT DOCUMENTS

| | | |
|---|---|---|
| EP | 2034538 | 3/2009 |
| JP | 2001118682 A * | 4/2001 |
| JP | 0263988 | 2/2002 |
| JP | 200511610 | 1/2005 |
| JP | 2007123392 | 5/2007 |
| JP | 2007254297 | 10/2007 |
| JP | 2008074939 | 4/2008 |
| WO | 0057676 | 9/2000 |
| WO | 0139234 | 5/2001 |
| WO | 0202714 | 1/2002 |
| WO | 0215645 | 2/2002 |
| WO | 02074015 | 9/2002 |
| WO | 03100880 | 4/2003 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |

(56) References Cited

FOREIGN PATENT DOCUMENTS

| | | |
|---|---|---|
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Hiramoto, et al., Synthetic Metals, (1997,) vol. 91, pp. 77-79.
Thoms, et al., Thin Solid Films, 436 (2003), 264-268.
Baldo, et al., Pure and Applied Chemistry, (1999), vol. 71, No. 11, pp. 2095-2106.
Machine translation, JP 2002-063988, Kohama et al., Year: 2002.
Machine translation, JP 2001-118682, Toyama et al., Year: 2001.
Adachi, et al., "High-efficiency organic electrophosphorescent devices with tris(2-phenylpyridine) iridium doped into electron-transporting materials", App. Phys. Lett., vol. 77, No. 6, pp. 904-906, (Aug. 7, 2000).
Baldo, et al, "High-efficiency fluorescent organic light-emitting devices using a phosphorescent sensitizer", Nature. 403(6771):750-3, 2000.
Baldo, et al., "Organic Vapor Phase Deposition" Advanced Materials, vol. 10, No. 18, pp. 1505-1514, (Dec. 18, 1998).
Baldo, et al., "Excitonic singlet-triplet ratio in semiconducting organic thin film", Phys. Rev., B vol. 60, No. 20, pp. 14422-14428 (Nov. 15, 1999).
Baldo, et al., "Transient analysis of organic electrophosphorescence: I. Transient analysis of triplet energy transfer", Phys. Rev. B vol. 62, No. 16, pp. 10958-10966 (Oct. 15, 2000).
Baldo, et al., "Transient analysis of organic electrophosphorescence: I. Transient analysis of triplet-triplet annihilation" Phys. Rev. B vol. 62, No. 16, pp. 10967-10977 (Oct. 15, 2000).
Brown, et al., "Energy level line-up in polymer light emitting diodes via electroabsorption spectroscopy", IEE Proceedings Optoelectronics vol. 148, No. 1, pp. 74-80 (Feb. 2001).
Chen, et al., "Recent Developments in Molecular Organic Electroluminescent Materials", Macromol. Symp. 125: 1-48, 1997.
Cheng, et al., "High efficiency white light emission using a phosporescent sensitizer in organic light emitting devices", Optical and Quantum Electronics, 36(7):659-664, May 2004.
Cheng, et al., "White Organic Light Emitting Devices using a Phosphorescent Sensitizer", Appl. Physics Letters, 82 (24):4224-4226, Jun. 2003.
Cheng, et al., "Effect of phosporescent sensitizer on white organic light emitting devices", Chinese Physics Letters, 20(9):1607-1609, Sep. 2003.
Deshpande, et al., "White-light-emitting organic electroluminescent devices based on interlayer sequential energy transfer" Appl. Phys. Lett., vol. 75, No. 7, pp. 888-890 (Aug. 16, 1999).
Djurovich, et al., "Ir(III) Cyclometalated Complexes as Efficient Phosphorescent Emitters in Polymer Blend and Organic LEDs", Polymer Preprints, vol. 41, No. 1, pp. 770-771 (Mar. 2000).
Hide, et al., "White light from InGaN/conjugated polymer hybrid light-emitting diodes" Appl. Phys. Lett., vol. 70, No. 20, pp. 2664-2666 (May 19, 1997).
Hung and Chen, "Recent progress of molecular organic electroluminescent materials and devices", Mat. Sci and Eng. R, 39:143-222., 2002.
Kido et al., "Single-layer white light emitting organic electroluminescent devices based on dye-dispersed poly (N-vinylcarbazole)" Appl. Phys. Lett., vol. 67, No. 16, pp. 2281-2283 (Oct. 16, 1995).
Kunugi, et al., "A Vapochromic LED", J. Am. Chem. Soc., vol. 120, No. 3, pp. 589-590, 1998.
Kwong, et al., "Efficient, Saturated Red Organic Light Emitting Devices Based on Phosphorescent Platinum (II) Porphyrins" Chem. Mater., vol. 11, No. 12, pp. 3709-3713 (Dec. 1999).
Milliron, et al., "Surface oxidation activates indium tin oxide for hole injection" J. Appl. Phys., vol. 87, No. 1, pp. 572-576 (Jan. 1, 2000).
O'Brien, et al., "Improved energy transfer in electrophosphorescent devices", Applied Physics Letters, vol. 74, No. 3, pp. 442-444, (Jan. 18, 1999).
Sokolik, et al., "Bimolecular reactions of singlet excitons in tris(8-hydroxyquinoline) aluminum" Appl. Phys. Lett., vol. 69, No. 27, pp. 4168-4170 (Dec. 30, 1996).
Tang, et al., "Electroluminescence of doped organic thin films", J. Appl. Phys., vol. 65, No. 9, pp. 3610-3616 (May 1, 1989).
Tsutsui, et al., "High quantum efficiency in organic light-emitting devices with iridium-complex as a triplet emissive center", Japanese. J. Appl. Phys., Part 2, No. 12B, vol. 38, pp. L1502-1504 (Dec. 15, 1999).
Yang, et al., "Use of Poly(9-vinylcarbazole) as host material for iridium complexes in high efficiency organic light emitting devices", Japanese J. Appl. Phys., Part 2, No. 8A, vol. 39, pp. L828-829 (Aug. 1, 2000).
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90:183503-1-183503-3, Year: 2007.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett, vol. 75, No. 3, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 115-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).

(56) References Cited

OTHER PUBLICATIONS

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15)2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121(2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91209-215 (1997).

Shirota, Yasuhiko et al., "Starburst Molecules Based on p-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 87:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett., 69 (15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

\* cited by examiner

ORGANIC LIGHT EMITTING DEVICES

CROSS-REFERENCE TO RELATED APPLICATIONS

This application is a continuation application of U.S. patent application Ser. No. 11/105,666, filed Apr. 13, 2005, the disclosure of which is expressly incorporated herein by reference in its entirety.

JOINT RESEARCH AGREEMENT

The claimed invention was made by, on behalf of, and/or in connection with one or more of the following parties to a joint university corporation research agreement: Princeton University, University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDS that emit light using a combination of fluorescent emitters and phosphorescent emitters. In preferred embodiments the combined emission from the fluorescent and phosphorescent emitters sufficiently span the visible spectrum to give a white emission.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

The quality of white illumination sources can be fully described by a simple set of parameters. The color of the light source is given by its CIE chromaticity coordinates x and y (1931 2-degree standard observer CIE chromaticity). The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light.

When considering the use of these white light sources for illumination, the CIE color rendering index (CRI) may be considered in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source may have a CRI of about 80 or higher.

White OLEDs having only phosphorescent emissive materials may be highly efficient, but their operation stability is currently limited by the lifetime of the blue phosphorescent component. White OLEDs having all fluorescent emissive materials may have good operational stability, but their external quantum efficiency is generally about three times lower than that of all-phosphorescent white OLEDs. The present invention combines phosphorescent and fluorescent technologies in an improved device structure to achieve an improved balance of efficiency and lifetime in a white OLED.

SUMMARY

The present invention provides organic light emitting devices having a combined emission from at least two emissive materials. More specifically, the present invention provides an organic light emitting device comprising a cathode, a first emissive layer comprising a fluorescent blue emitting material, a second emissive layer comprising a phosphorescent emitting material, and an anode, wherein when a voltage is applied across the device, light is emitted from the emitting materials. In preferred embodiments, the combined emission of the emissive materials sufficiently spans the visible spectrum to give a white emission. In particularly preferred embodiments, the device further comprises a spacer layer between the first emissive layer and the second emissive layer.

Another embodiment of the present invention an organic light emitting device comprising an emissive region disposed between and electrically connected to an anode and a cathode, wherein the emissive region comprises a fluorescent blue emitting material, a phosphorescent green emitting material; and a phosphorescent red emitting material. The fluorescent blue emitting material is in a separate emissive layer from the phosphorescent red emitting material and the phosphorescent green emitting material, and the combined emission of the emitting materials sufficiently spans the visible spectrum to give a white emission. In particularly preferred embodiments, the device further comprises a spacer layer between the emissive layer comprising the fluorescent blue emitting material and the emissive layer comprising the phosphorescent emissive materials.

DETAILED DESCRIPTION

Figure 1:
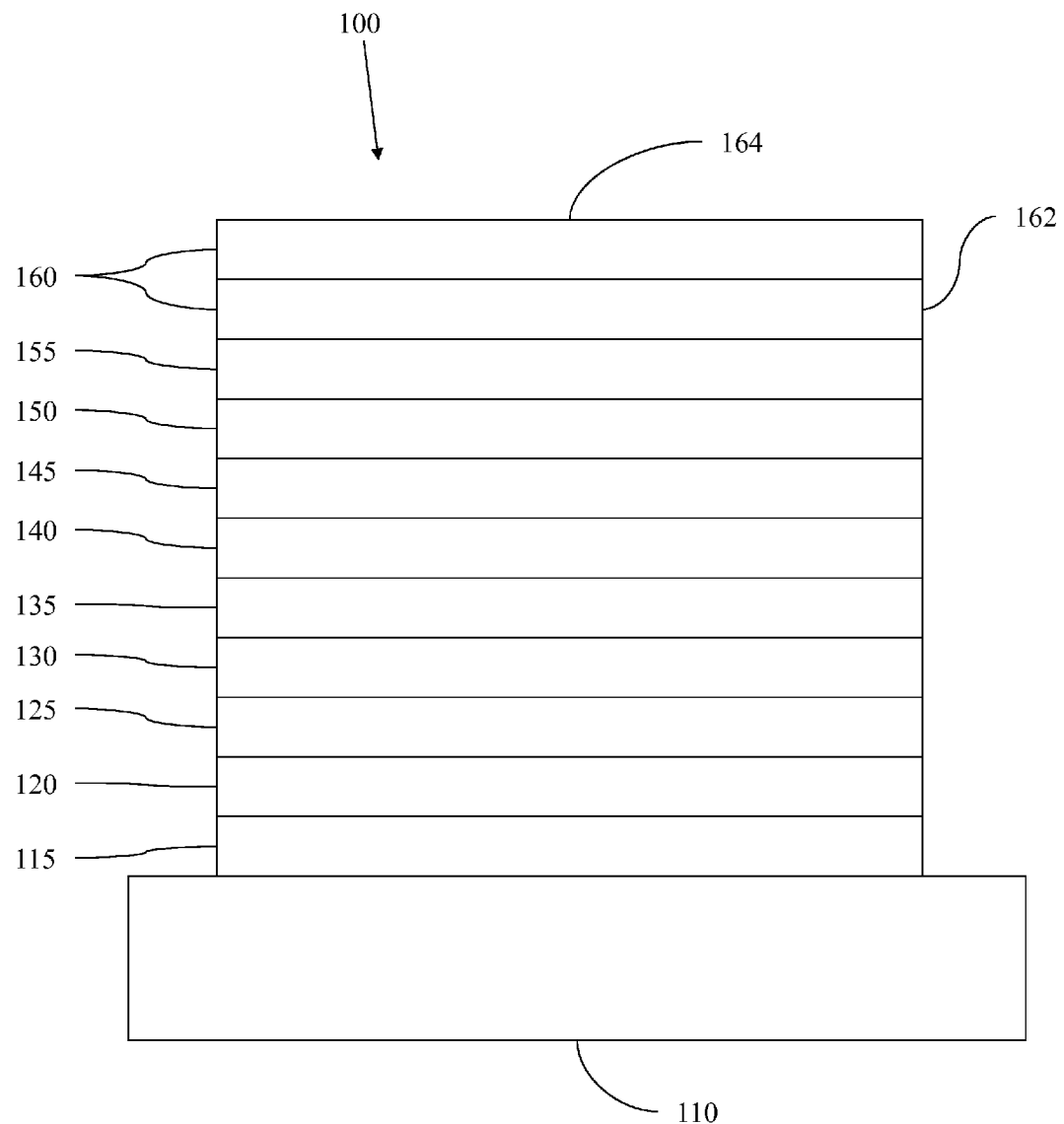
FIG. 1 shows an organic light emitting device having separate electron transport, hole transport, and emissive layers, as well as other layers.

The present invention provides organic light emitting devices having a combined emission from at least two emissive materials, a fluorescent blue emissive material and a phosphorescent emissive material. The device may further comprise additional fluorescent or phosphorescent emissive materials. In preferred embodiments, the invention provides OLEDs having three different emissive materials—a red emissive material, a green emissive material and a blue emissive material. The invention provides a device architecture which is optimized for efficiency and lifetime by using a combination of fluorescent and phosphorescent emitters. Further, in preferred embodiments the device architecture provides a high color-stability of the light emission over a wide range of currents or luminances. Further, the invention provides devices that emit light from a combined emission with a high external quantum efficiency. In preferred embodiments the devices of the invention have a maximum external quantum efficiency of at least about 4.5%, or more preferably at least about 5.0%, and still more preferably at least about 6.0%.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive region 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-02309890 to Forrest et al., which is incorporated by reference in its entirety. Other hole transport layers may be used.

Emissive region 135 is comprised of at least two adjacent emissive layers, each of which includes an organic material capable of emitting light when a current is passed between anode 115 and cathode 160. At least one of the emissive materials should be a phosphorescent emissive material, and at least on of the emissive materials should be a fluorescent emissive material. Phosphorescent materials are preferred because of the higher luminescent efficiencies associated with such materials. An emissive layer may comprise other materials, such as dopants that tune the emission of the emissive material. The emissive region includes a plurality of emissive materials capable of, in combination, emitting a desired spectrum of light. Examples of phosphorescent emissive materials include $Ir(ppy)_3$. Examples of fluorescent emissive materials include DCM and DMQA. The emissive layers of the emissive region 135 may also comprise a host material capable of transporting electrons and/or holes, doped with an emissive material that may trap electrons, holes, and/or excitons, such that excitons relax from the emissive material via a photoemissive mechanism. Examples of host materials include $Alq_3$. CBP and mCP. Examples of emissive and host materials are disclosed in U.S. Pat. No. 6,303,238 to Thompson et al., which is incorporated by reference in its entirety. Emissive material may be included in an emissive layer in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer, or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
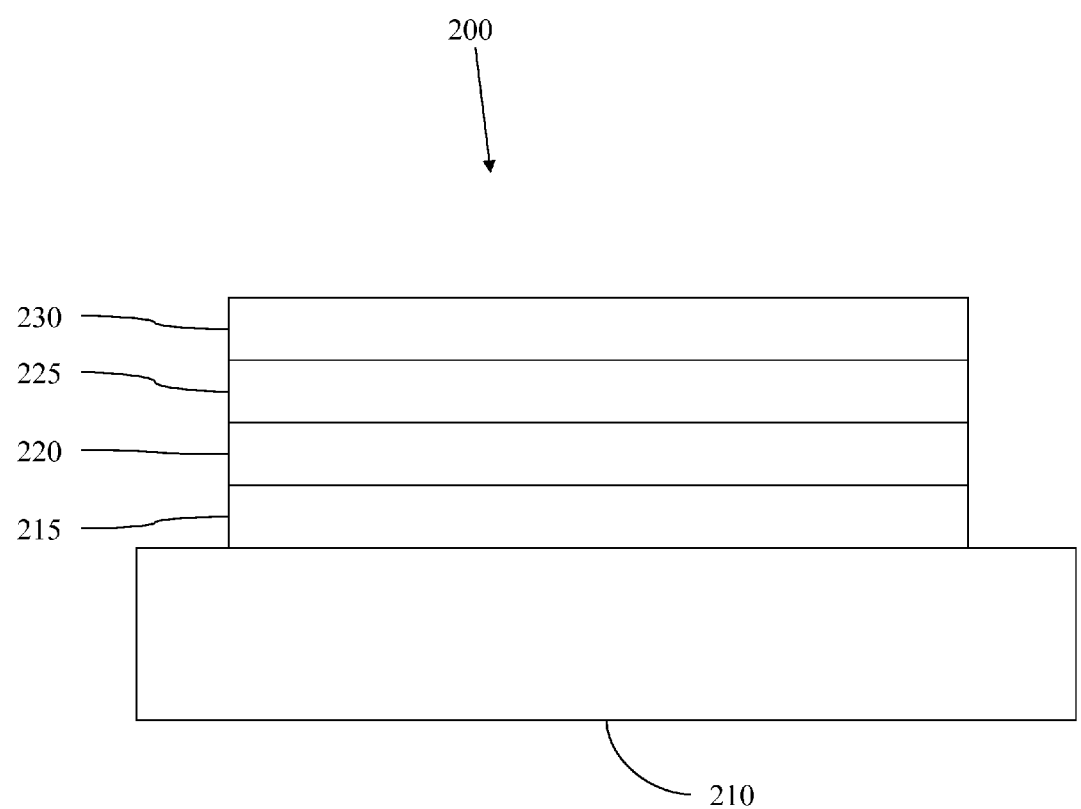
FIG. 2 shows an inverted organic light emitting device that does not have a separate electron transport layer.

FIG. 2 shows an inverted OLED 200. The device includes a substrate 210, an cathode 215, an emissive region 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive region 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The devices of the present invention comprise an emissive region, wherein the emissive region has at least two adjacent emissive layers, a first emissive layer and a second emissive layer. In one embodiment, each emissive layer comprises a host material and at least one emissive dopant material. The first emissive layer is comprised of a first host material and a first emissive material, and the second emissive layer is comprised of a second host material and a second emissive material. The host materials for the two or more emissive layers may be the same or may be different, however, in preferred embodiments the hosts comprise different materials. In preferred embodiments, the emissive region further comprises a spacer layer between the two adjacent emissive layers.

In a preferred embodiment of the invention, the emissive region of the devices of the present invention comprises at least one blue fluorescent emissive material. To date, phosphorescent blue emitters have generally displayed poor operational stability in OLEDs. Fluorescent blue emitters are selected to have good operational lifetimes in OLEDs. The emissive layer that comprises the fluorescent blue emissive material may not further be comprised of a phosphorescent emissive material. It is believed that the low triplet energy of the fluorescent blue emissive material would quench the emission from the phosphorescent material if the emissive materials were mixed within the same emissive layer. Thus, the fluorescent blue emissive material will be present in a separate emissive layer from the phosphorescent emissive materials. In certain embodiments, the emissive layer comprising the fluorescent blue emissive material will further comprise additional fluorescent emissive materials.

The invention provides efficient white-emitting or multi-colored emitting OLEDs. For white emitting devices, the combined emission of the emitting materials gives a white emission from the device. For preferred white-emitting devices, the two or more emissive dopants are selected so that the combined emission from the device has a CIE range between X=0.37±0.07 and Y=0.37±0.07. More preferably, the CIE coordinates are X=0.35±0.05, and Y=0.35±0.05 and even more preferably X=0.33±0.02, Y=0.33±0.02. The term "multicolored" refers to the emission from a device that results from two or more different emissive dopants that each have different emissive spectra. Although a high CRI value may be preferred for certain lighting applications, the devices of the present invention may be used to produce a light source that provides other colors as well. In preferred embodiments, the devices of the present invention are capable of achieving an external quantum efficiency of at least about 6%. The devices of the present invention preferably have lifetimes of greater than about 200 hours at a current density of 40 mA/cm$^2$. More preferably the devices have a lifetime of greater than about 400 hours and still more preferably have a lifetime greater than about 1000 hours.

In a preferred embodiment, each emissive layer comprises a different host material and at least one emissive dopant material. In this embodiment, the first host material and the second host material are different chemical compounds. In preferred embodiments, the different host materials of the adjacent emissive layers may be selected so as to provide a "heterojunction" between the emissive layers that localizes recombination of electrons and holes at or near the heterojunction. The heterojunction may provide a narrow zone for the recombination of electrons and holes which does not shift significantly as a function of the drive current applied to the device. Recombination occurs primarily at or near the heterojunction and the resulting excitons may diffuse to both sides of the heterojunction. As the emissive layers that form the heterojunction contain different emissive dopants, the device emission spectrum contains the electroluminescence from multiple emissive materials. Thus, this device structure may provide a high color-stability of the light emission over a wide range of currents or luminances.

In one embodiment, the heterojunction between the adjacent emissive layers of the emissive region provides an electron injection barrier. In this case, electrons are inhibited from crossing the heterojunction between the emissive layers. Electrons, originating at the cathode, are transported through the emissive layer on the cathode-side of the junction. The host materials of the emissive layers that form the heterojunction are selected such that electrons, upon reaching the heterojunction, are inhibited from transport into or through the emissive layer on the anode-side of the junction. This may be achieved by selecting the different host materials of the emissive layers that form the heterojunction based on the relative LUMOs of the two host materials. The host material of the emissive layer on the anode-side of the heterojunction is selected to have a LUMO that is higher than the host material of the emissive layer on the cathode-side of the heterojunction. The difference in the LUMO levels of the first and second emissive layer should preferably be at least 0.25 eV, more preferably at least 0.3 eV, and even more preferably at least 0.7 eV. In another embodiment, the emissive layer on the anode-side of the junction may have a lower electron mobility than the emissive layer on the cathode-side of the junction.

In another embodiment of the invention, the heterojunction between the adjacent emissive layers of the emissive region provides a hole injection barrier. In this case, holes are inhibited from crossing the heterojunction between the emissive layers. Holes, originating at the anode, are transported through the emissive layer on the anode-side of the junction. The host materials of the emissive layers that form the heterojunction are selected such that holes, upon reaching the heterojunction, are inhibited from transport into or through the emissive layer on the cathode-side of the junction. This may be achieved by selecting the different host materials of the emissive layers that form the heterojunction based on the relative HOMOs of the two host materials. The host material of the emissive layer on the cathode-side of the heterojunction is selected to have a HOMO that is lower than the host material of the emissive layer on the anode-side of the heterojunction. The difference in the HOMO levels of the first and second emissive layer should preferably be at least 0.25 eV, more preferably at least 0.3 eV, and even more preferably at least 0.7 eV. In another embodiment, the emissive layer on the cathode-side of the junction may have a lower hole mobility than the emissive layer on the cathode-side of the junction.

In a further embodiment of the invention, the heterojunction may display any combination of the properties that work to localize recombination at or near the heterojunction. For example, the heterojunction may provide both an electron injection barrier and a hole injection barrier.

The electronic properties of the host materials (for example, when the host is an undoped thin layer) are believed be a good approximation of the electronic properties of the doped layer. Thus, for example, the electron mobility of the doped layer is approximated by the electron mobility of the host material. In the case of phosphorescent dopants, which are generally present at a concentration of about 6%, the dopant itself may contribute to the electronic properties of the doped layer. In the cases where the phosphorescent dopant does contribute to the electronic properties of the layer, it may be useful to describe the properties (e.g., LUMO, HOMO, electron mobility, hole mobility, etc.) as being a property of the doped layer.

In the preferred embodiments in which the emissive region comprises a spacer region between the blue fluorescent emissive layer and the adjacent phosphorescent emissive layer, the heterojunction as described above will be created by the interface between the spacer layer and one of the adjacent emissive layers. In further preferred embodiments, the heterojunction is provided by the interface between the spacer layer and the blue fluorescent emissive layer.

The emissive region may be comprised of additional emissive layers. In another embodiment of the invention, the emissive region has three emissive layers. Two of the adjacent emissive layers form the heterojunction as described above. An additional emissive layer may be adjacent to either the emissive layer on the cathode-side of the junction or the emissive layer on the anode-side of the heterojunction. The additional layer may be comprised of a host material and an emissive dopant. Preferably, the emissive dopant emits at a different frequency than the emissive dopants of the two emissive layers that form the heterojunction. The host material for this layer may be the same or different from the host materials of the two emissive layers that form the heterojunction, although in preferred embodiments the host material will be will be the same as an adjacent emissive layer.

In one embodiment of the invention, the emissive region comprises three emissive material—a fluorescent blue emitter, a fluorescent green emitter, and a phosphorescent red emitter. The fluorescent blue emitter and the fluorescent green emitter may be combined in the same emissive layer or may be in separated emissive layers. The phosphorescent red emissive material will be in a separate emissive layer within the emissive region. In preferred embodiments, each emissive layer will comprise the emissive material(s) in a host material. The host material may be the same or may be different for each of the emissive layers. In preferred embodiments, the host material for the fluorescent emissive materials is different than the host for the phosphorescent emissive material. In particularly preferred embodiments, the interface between the host material for the fluorescent emissive materials and the host for the phosphorescent emissive material forms a heterojunction as described above.

In another embodiment of the invention, the emissive region comprises three emissive material—a fluorescent blue emitter, a phosphorescent green emitter, and a phosphorescent red emitter. The phosphorescent green emitter and the phosphorescent red emitter may be combined in the same emissive layer or may be in separated emissive layers. The fluorescent blue emissive material will be in a separate emissive layer within the emissive region. In preferred embodiments, each emissive layer will comprise the emissive material(s) in a host material. The host material may the same or may be different for each of the emissive layers. In preferred embodiments, the host material for the fluorescent emissive material is different than the host for the phosphorescent emissive materials. In particularly preferred embodiments, the interface between the host material for the fluorescent emissive material and the host for the phosphorescent emissive materials forms a heterojunction as described above.

In particularly preferred embodiments of the present invention, the emissive region further comprises a spacer layer between the host material for the fluorescent emissive material(s) and the host for the phosphorescent emissive material(s). As noted above, fluorescent materials generally have low triplet energies and, therefore, may quench the triplet emission from the phosphorescent emissive materials. Further, the host for the fluorescent material(s) may also have a low enough triplet energy such that it would cause quenching. The spacer layer provides a buffer that separates the fluorescent blue emissive material from the phosphorescent emissive material(s). The spacer layer need only be thick enough to inhibit quenching. Further, the spacer layer should be sufficiently thin that the excitons formed at or near the heterojunction, which is formed at the interface between the spacer and one or both adjacent emissive layers, can diffuse to the other adjacent emissive layer. Further, a thin layer has a smaller effect on the drive voltage of the device. Thus, in preferred embodiments the spacer layer is between about 10 Å to 50 Å thick, and in particularly preferred embodiments the spacer layer is between about 10 Å to 25 Å thick. The spacer layer preferably comprises a material that has a higher triplet energy than the triplet energy of the phosphorescent emissive material(s). In preferred embodiments the spacer layer is comprised of the host material for the phosphorescent emissive material(s).

Fluorescent blue emitters preferably emit visible light with a peak wavelength of less than about 470 nm, and more preferably less than about 450 nm. In preferred embodiments, the fluorescent blue emitter emits light having CIE coordinates of about x=0.15±0.02, and about y≤0.15. Preferred fluorescent blue emitters include polyaromatic compounds such as 9,10-di(2-naphthylantracene), perylenes, phenylenes, and fluorenes. Preferred fluorescent blue emitters may be found in C. H. Chen, J. Shi, and C. W. Tang, "Recent Developments in Molecular Organic Electroluminescent Materials," Macromol. Symp. 125, pp. 1-48 (1997) and the references cited therein; L. S. Hung and C. H. Chen, "Recent progress of molecular organic electroluminescent materials and devices," Mat. Sci and Eng. R, 39 (2002), pp. 143-222 and the references cited therein, each of which is incorporated herein by reference in their entirety.

Particularly preferred fluorescent blue emitters include arylpyrenes as described in the co-pending application entitled "Arylpyrene Compounds," Attorney Docket No. 10052-7401, filed Apr. 4, 2005, which is incorporated herein by reference in its entirety. The preferred arylpyrenes can be generally described by formula IV: The arylpyrene compound can be generally described by formula IV:

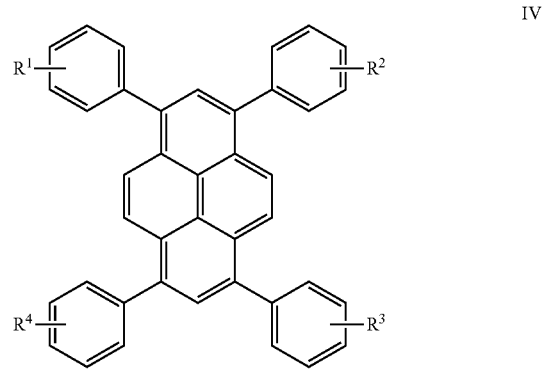

IV

In one embodiment, each R group is the same substituent. Substituents include, for example, R', O—R', N(R')$_2$, SR', C(O)R', C(O)OR', C(O)NR'$_2$, CN, CF$_3$, NO$_2$, SO$_2$, SOR', SO$_3$R', or halo. Any two substituents on adjacent ring atoms can optionally form a 5- or 6-member cyclic group, such that the 1-, 3-, 6-, or 8-aryl group is a fused ring group, such as a naphthyl or phenanthryl group. The fused ring may be optionally substituted with one or more substituents, as defined above. Each R' is independently H, alkyl, alkenyl, alkynyl, heteroalkyl, aralkyl, aryl, or heteroaryl. In one embodiment, the R group is a straight, branched, or cyclic C$_{1-10}$ alkyl group or a fused ring group. It is believed that alkyl substituents improve the solubility of the compound, thereby making the compound better suited for deposition by solution process. Branched alkyl substituents may be particularly effective at increasing solubility.

In one embodiment, the arylpyrene compound is selected from the group consisting of formulas I, II, and III.

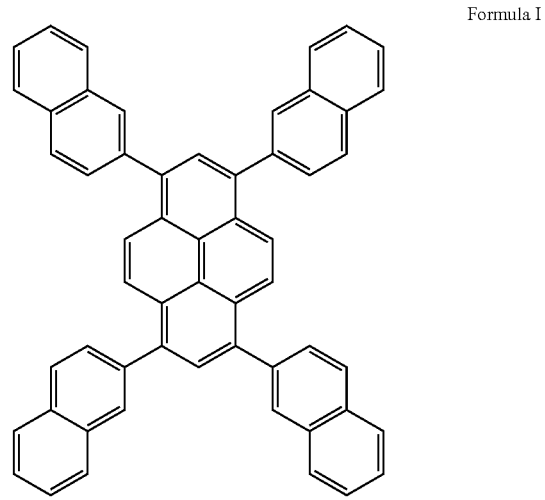

Formula I 1,3,6,8-tetra(2-naphthyl)pyrene

-continued

Formula II

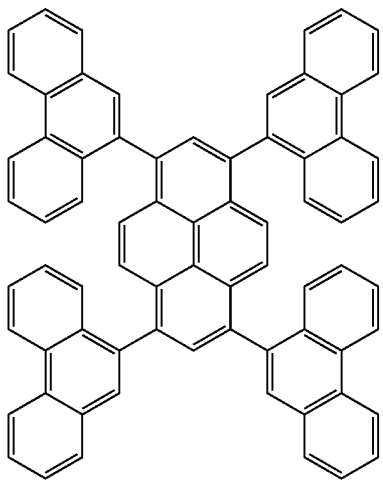

1,3,6,8-tetra(9-phenanthryl)pyrene

Formula III

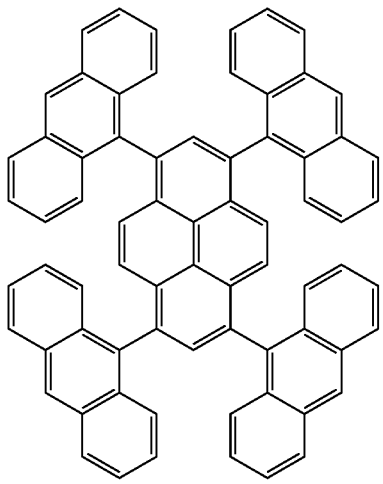

1,3,6,8-tetra(9-anthryl)pyrene

In each of formulas I, II, and III, each of the 1-, 3-, 6-, and 8-aryl groups may be optionally and independently substituted with one or more substituents. Thus, in one embodiment, each aryl group, e.g., the naphthyl group in formula I, is unsubstituted. In another embodiment, each aryl group may have unique substituent(s). For example, the aryl groups may be independently substituted with a straight, branched, or cyclic $C_{1-10}$ alkyl group or a fused ring group.

Other particularly preferred blue fluorescent emitters include arylenevinylene compounds as described in U.S. Pat. Nos. 5,121,029 and 5,130,603, which are incorporated herein by reference in their entirety. The arylenevinylene compounds may have the general formula:

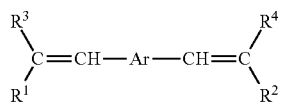

wherein $R^1$ and $R^2$ are each an alkyl, cyclohexyl, alkoxy, cyano or aryl, $R^3$ and $R^4$ are a heterocyclic or aryl and Ar is an divalent aromatic group. In preferred embodiments, $R^1$, $R^2$, $R^3$ and $R^4$ are independently selected from an aromatic group.

Other preferred arylenevinylene compounds may have the general formulas:

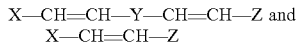

wherein X and Z are independently an aromatic group and Y is a divalent aromatic group. In preferred embodiments, X and Z independently represent an unsubstituted phenyl group or an alkyl-substituted phenyl group having an alkyl group with 1 to 4 carbon atoms and Y represents an unsubstituted phenylene group or a mono alkyl-substituted phenylene group having an alkyl group with 1 to 4 carbon atoms.

In one embodiment of the invention the blue fluorescent material may be present as a neat layer. In preferred embodiments of the invention, the blue fluorescent material would be present as a dopant in a host material. Preferred host materials for the blue fluorescent emitters include, for example, anthracenes and carbazoles. Anthracene hosts include, but are not limited to 9,10-di(2-naphthyl)anthracene (ADN) and 9,10-di[3-(N-carbazole)phenyl]-anthracene (B3CPA). In a preferred embodiment, the anthracene host is ADN. The preferred host materials (such as the anthracene hosts) are good electron transporting materials. Thus, in preferred embodiments the emissive layer comprising the fluorescent blue material is on the cathode-side of the heterojunction.

Green emitters preferably emit visible light with a peak wavelength between about 500 nm to about 550 nm. In preferred embodiments, the green emitter emits light having CIE coordinates of about x=0.30, and about y=0.60. Preferred fluorescent green emitters include the coumarin dyes, julolidine dyes, quinacridones, and imidazolinones. A discussion of preferred fluorescent emissive materials may be found in C. H. Chen, J. Shi, and C. W. Tang, "Recent Developments in Molecular Organic Electroluminescent Materials," Macromol. Symp. 125, pp. 1-48 (1997) and the references cited therein; L. S. Hung and C. H. Chen, "Recent progress of molecular organic electroluminescent materials and devices," Mat. Sci and Eng. R, 39 (2002), pp. 143-222 and the references cited therein, each of which is incorporated herein by reference in their entirety. Preferred green phosphorescent emitters include derivatives of 2-phenylpyridine-iridium complexes, such as Ir(Ph-ppy)$_3$. Preferred phosphorescent green emitters may be found in Baldo, M. A., Thompson, M. E. & Forrest, S. R. High efficiency fluorescent organic light-emitting devices using a phosphorescent sensitizer, Nature 403, 750-753 (2000); and in U.S. Pat. No. 6,830,828, each of which is incorporated herein by reference in their entirety.

Phosphorescent red emitters preferably emit visible light with a peak wavelength between about 600 nm to about 630 nm. In preferred embodiments, the red emitter emits light having CIE coordinates of about x=0.67±0.03, and about y=0.33±0.03. Preferred phosphorescent red emitters are derivatives of 2-phenylpyridine-iridium complexes, such as Ir(Me-pq)$_2$(acac). Preferred phosphorescent red emitters may be found in U.S. Pat. Nos. 6,835,469 and 6,830,828, each of which is incorporated herein by reference in their entirety.

The HOMO and LUMO energy levels for organic materials to be used in OLEDs have been estimated in several ways. The two common methods for estimating HOMO levels are solution electrochemistry and ultraviolet photoelectron spectroscopy (UPS). The two common methods for estimating LUMO levels are solution electrochemistry and inverse photoemission spectroscopy. These energies are useful for predicting the interactions described herein between the emissive material and the host material of the emissive layer. Additionally, the alignment of the HOMO and LUMO levels between adjacent layers will control the passage of hole and electrons between the two layers.

The most common method for determining oxidation and reduction potentials is cyclic voltammetry. A simple description of this process is as follows. The unknown is dissolved along with a high concentration of electrolyte. Electrodes are inserted and the voltage scanned in either the positive or negative direction (depending on whether an oxidation or reduction is being performed). The presence of a redox reaction is indicated by current flowing through the cell. The voltage scan is then reversed and the redox reaction is reversed. If the areas of the two redox waves are the same the process was reversible. The potential at which these events occur give the value of the reduction or oxidation potential relative to a reference. The reference can be an external electrode, such as Ag/AgCl or SCE, or it can be an internal one, such as ferrocene, which has a known oxidation potential. The latter is often preferred for organic solvents, since the common reference electrodes are water based. Although this is a solution process, in contrast to the solid state OLED, and the reference may be hard to adjust to give values relative to vacuum, the method is good for giving relative numbers. One useful parameter that may come from electrochemical measurement is the carrier gap. If both the reduction and oxidation are reversible, one can determine the energy difference between the hole and the electron (i.e. taking an electron out of the HOMO versus putting one into the LUMO). This value is important to determine the LUMO energy from a well defined HOMO energy. If either of the redox processes are not reversible, the carrier gap cannot be determined by this method.

The preferred method to estimate HOMO energies in the solid state is UPS. This is a photoelectric measurement, where the solid is irradiated with UV photons. The energy of the photons is gradually increased until photogenerated electrons are observed. The onset of ejected electrons gives the energy of the HOMO. The photons at that energy have just enough energy to eject an electron form the top of the filled levels. Inverse photoemission involves pre-reducing the sample and then probing the filled states to estimate the LUMO energies. The best accepted method for determining HOMO energies is UPS, which gives values in eV relative to vacuum. This is the binding energy for the electron.

Another important parameter is the optical gap. This value is typically determined from the intersection of the normalized absorption and emission spectra. For a molecule that has very little structural rearrangement in the excited state, the gap between the absorption and emission $\lambda_{max}$ values is rather small and this intersection energy is a good estimate of the optical gap (the 0-0 transition energy). This is often held to be the HOMO-LUMO gap. In some cases, this can be a poor estimation if the shift between the absorption and emission maxima is large (Stokes shift), such that the optical gap is hard to determine. If there is a structural rearrangement in the excited state or the absorption that is measured is not the one for the lowest energy excited state, then there can be a large error. Alternatively, the edge of the absorption or emission bands may be used to estimate the optical gap. In some cases, this is a poor estimate. When the optical gap is used to estimate LUMO energies from a measured HOMO energy, it is most useful for a well behaved molecule (i.e. a small Stokes shift), where it is close to the HOMO-LUMO gap. Even in this case, a carrier gap may be a better estimate and may be larger than the optical gap. If one is concerned about exciton blocking, the edge of the absorption band is more useful, as this will give the energy below which excitons will not be efficiently trapped. That is to say, if an exciton of lower energy than the band edge of the materials approaches a layer with a higher energy absorption edge the likelihood that the exciton will be transferred into this material is low. For molecules emitting from triplet excited states, the absorption edge is the best estimate, since the intersystem crossing may lead to a very large Stokes shift.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions

As used herein, abbreviations refer to materials as follows:
CBP: 4,4'-N,N-dicarbazole-biphenyl
m-MTDATA 4,4',4"-tris(3-methylphenylphen lyamino)triphenyl amine
Alq$_3$: 8-tris-hydroxyquinoline aluminum
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
Ir(4,6-F$_2$ppy)$_2$(BPz$_4$) iridium(III) bis(2-(4,6-difluorphenyl) pyridinato-N, C$^2$)η$^2$-N,N'-(tetrakis(1-pyrazolyl)borate)
Ir(pq)$_2$(acac) (2,4-pentanedionato-κO,κO')bis[2-(2-quinolinyl-κN)phenyl-κC]iridium
Ir(Me-pq)$_2$(acac) bis[2-(3-methyl-2-quinolinyl-κN)phenyl-κC](2,4-pentanedionato-κO,κO') iridium
Ir(F$_2$CNppy)$_2$(pic) Bis[2-(4,6-difluoro-5-cyanophenyl)pyridine]Iridium(III)picolinate
Ir(Ph-ppy)$_3$ Iridium(III)tris-[2-(3-biphenyl)pyridine]
TPBi 2,2',2"-(1,3,5-benzenetriyl)tris-(1-phenyl-1H-benzimidazole)
DTBD 2,2'-dimethyl-N,N,N',N'-tetraphenyl-[1,1'-biphenyl]-4,4'-diamine
BFD47 1,3,6,8-tetra(2-naphthyl)pyrene
ADN: 9,10-di-(2-naphthyl)anthracene

EXPERIMENTAL

Specific representative embodiments of the invention will now be described, including how such embodiments may be made. It is understood that the specific methods, materials, conditions, process parameters, apparatus and the like do not necessarily limit the scope of the invention.

Device Fabrication

Prior to device fabrication, indium tin oxide (ITO) on glass was patterned as 2.2 mm wide stripes (sheet resistance ~20Ω/□). The substrates were cleaned by sonication in soap solution, rinsing with deionized water, boiling in trichloroethylene, acetone and ethanol for 3-4 min in each solvent. After the cleaning procedure, the substrates were dried under an $N_2$ flow followed by UV ozone treatment for 10 min.

Organic layers of the OLEDs were sequentially deposited by thermal evaporation from resistively heated aluminum oxide crucibles onto the substrates at room temperature at a base pressure of ~3-8×$10^7$ Torr, at 2.5Å/s. The rate of a single-component layer was controlled with one Inficon thickness monitor located close to the substrate. For the two-component emissive layer the rate of the dopant was controlled with an additional crystal monitor located close to the dopant evaporation source. The additional monitor was not exposed to the major flow of the host, which allowed increasing the precision of the dopant concentration.

The devices were encapsulated and characterized after fabrication. Current-voltage measurements were made with a Keithley source meter (model 2400). Spectra and light intensity were measured using a PhotoResearch 705 model spectrophotometer and calibrated photodiode.

Example 1

Figure 3:
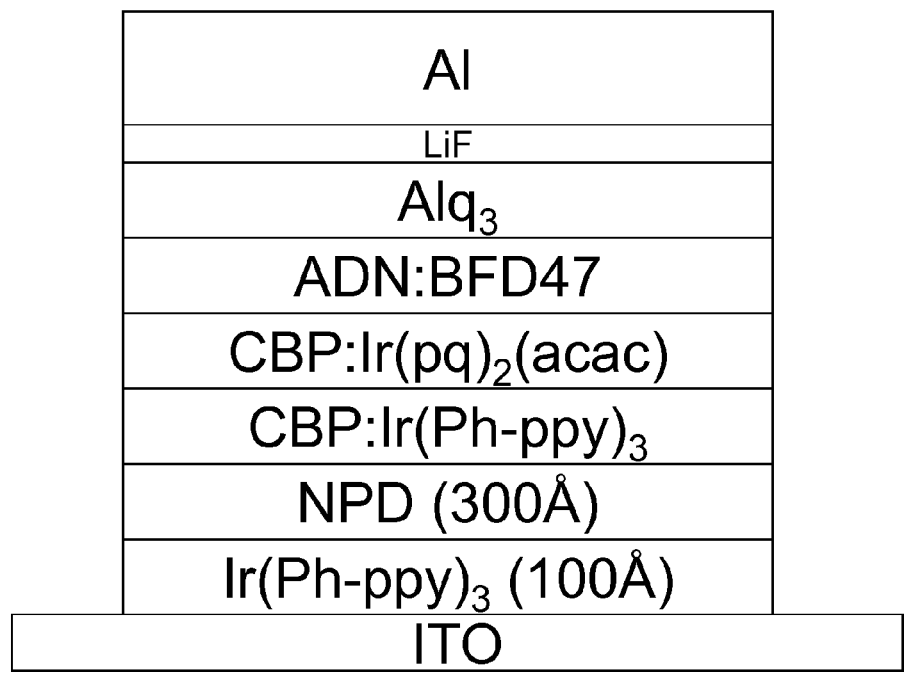
FIG. 3 shows the device structure for the devices of Examples 1 and 2.
Figure 6:
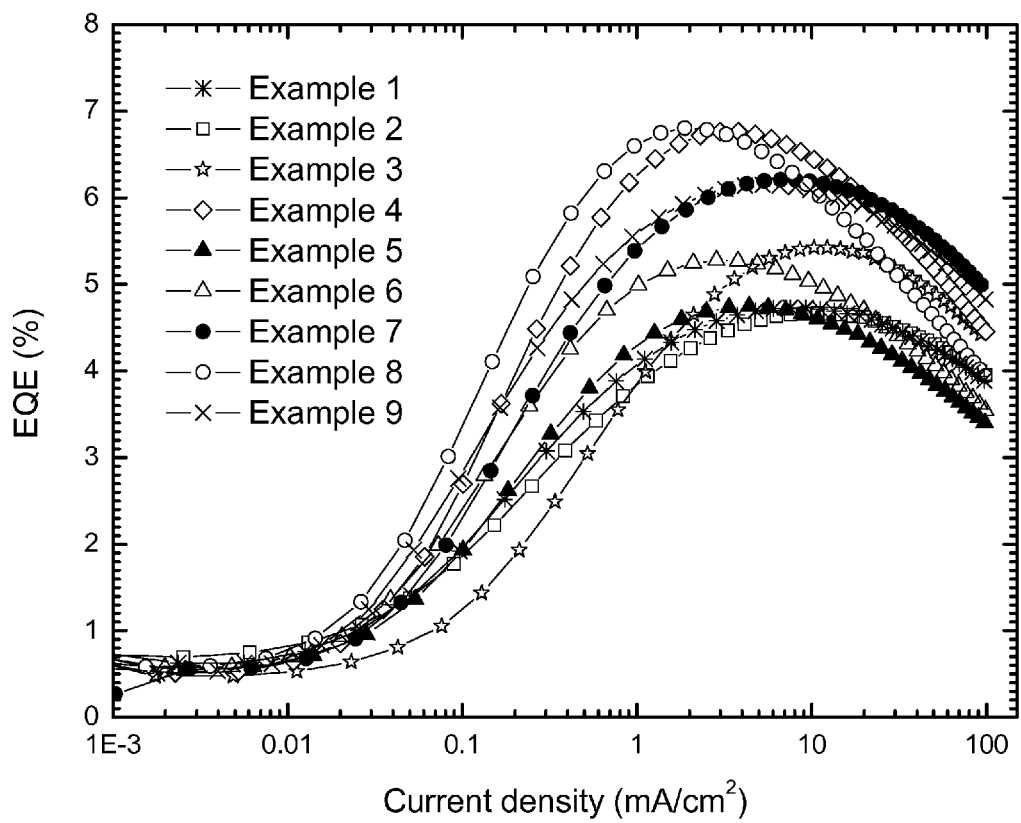
FIG. 6 shows external quantum efficiency vs. current density for the devices of the examples.
Figure 7:
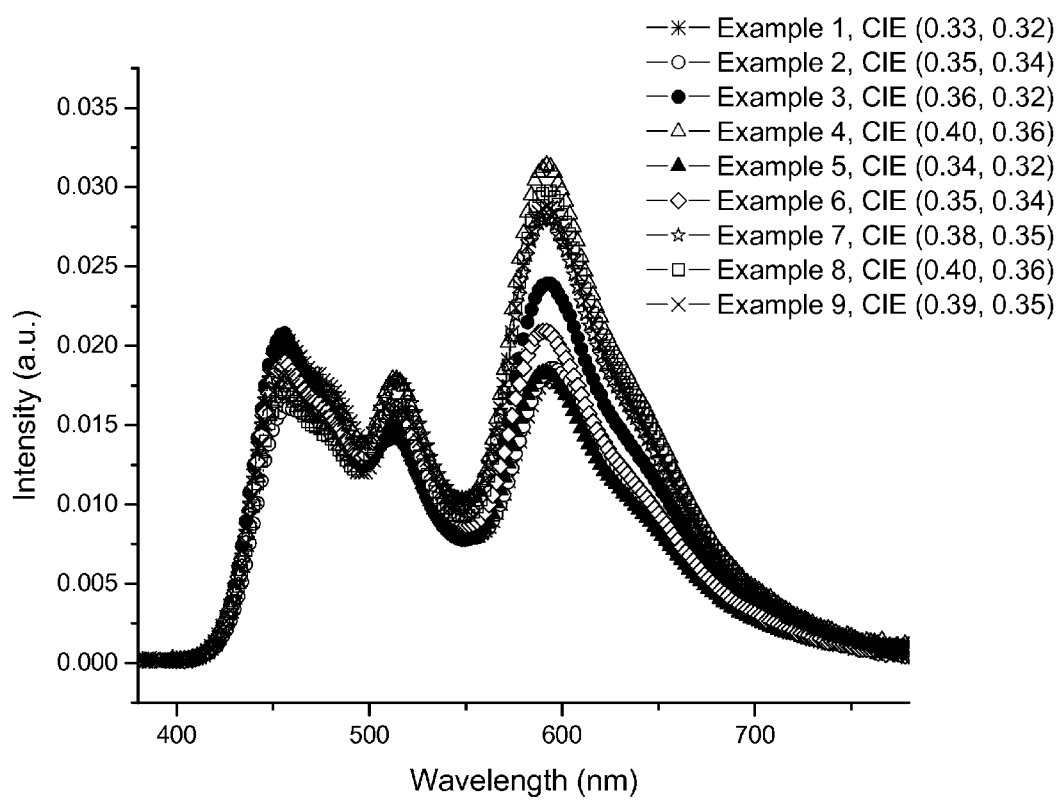
FIG. 7 shows the emission spectra at a current density (J) of 10 mA/cm$^2$ for the devices of the examples.
Figure 8:
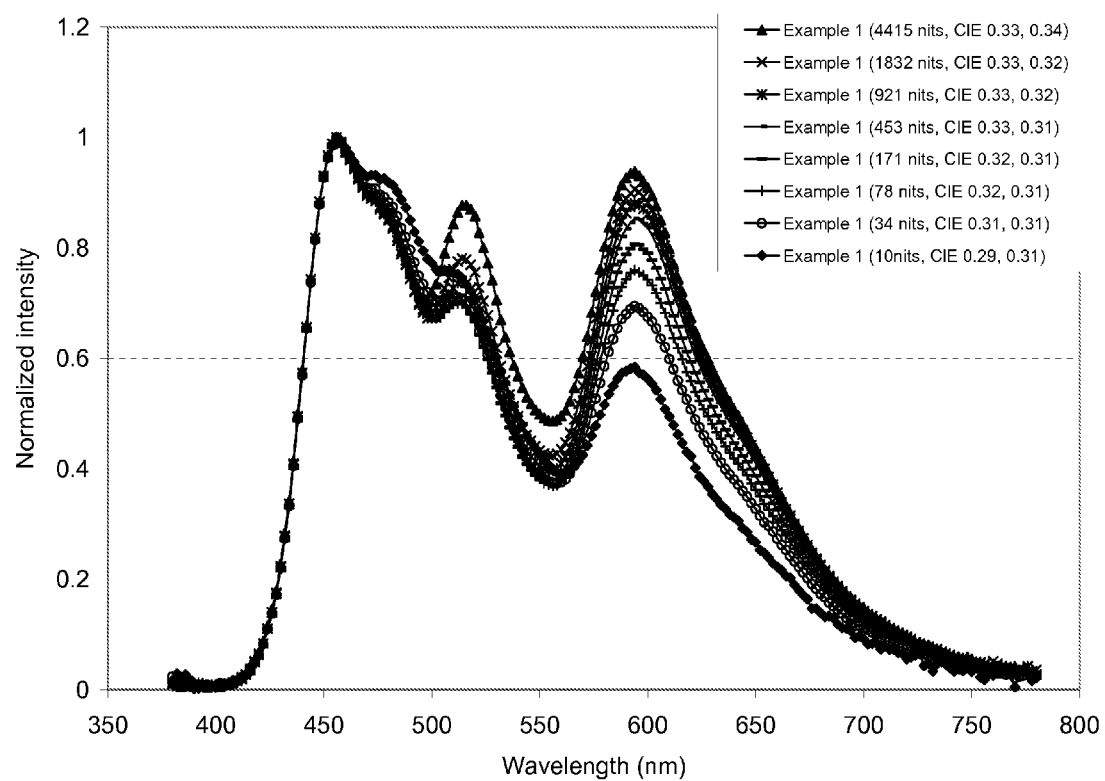
FIG. 8 shows the emission spectra for the device of Example 1 at various current densities.

An OLED was prepared with the structure ITO/Ir(Ph-ppy)$_3$(100 Å)/NPD(300 Å) CBP:Ir(Ph-ppy)$_3$ (75 Å, 12%)/CBP:Ir(pq)$_2$(acac) (25 Å, 6%)/ADN:BFD47(300 Å, 6%)/Alq$_3$(300 Å)/LiF(5 Å)/Al(1000 Å). The device structure is depicted schematically in FIG. 3. FIG. 6 shows the plot of the external quantum efficiency versus current density for this device, which has a maximum external quantum efficiency of 4.7%. The plots of the normalized emission spectra at various current densities (brightness) are shown in FIG. 8. As can be seen in FIG. 8, the device shows a high color-stability of the light emission over a wide range of currents or luminances.

Example 2

An OLED was prepared with the structure ITO/Ir(Ph-ppy)$_3$ (100 Å)/NPD(300 Å)/CBP: Ir(Ph-ppy)$_3$(75 Å, 9%)/CBP: Ir(pq)$_2$(acac)(25Δ, 6%)/ADN:BFD47(200 Å, 6%)/Alq$_3$(400 Å)/LiF(5 Å)/Al(1000 Å). The device structure is depicted schematically in FIG. 3. FIG. 6 shows the plot of the external quantum efficiency versus current density for this device, which has a maximum external quantum efficiency of 4.7%.

Example 3

Figure 4:
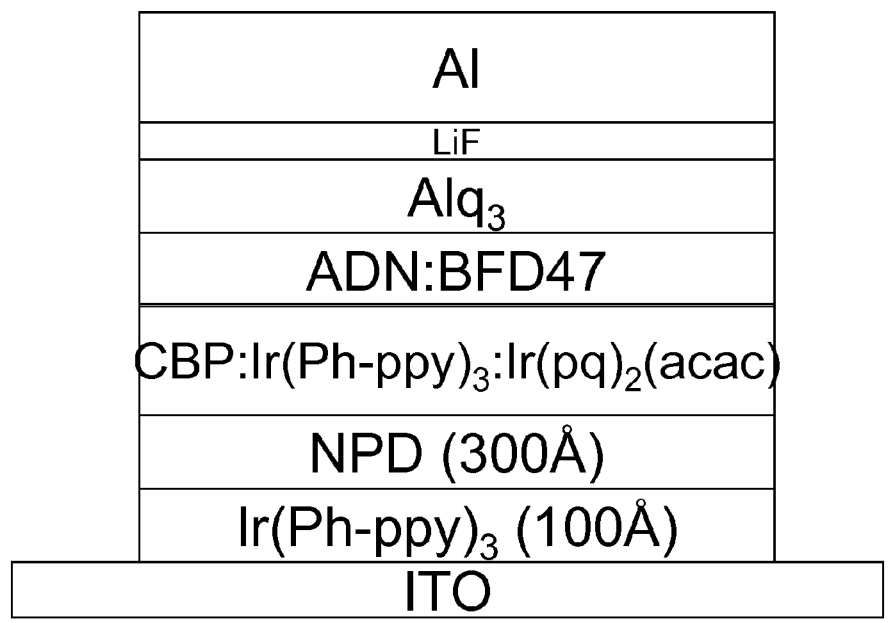
FIG. 4 shows the device structure for the devices of Example 3.

An OLED was prepared with the structure ITO/Ir(Ph-ppy)$_3$(100 Å)/NPD(300 Å)/CBP: Ir(Ph-ppy)$_3$(6%):Ir(pq)$_2$(acac)(1%)(100 Å)/ADN:BFD47(300 Å, 6%)/Alq$_3$(300 Å)/LiF(5 Å)/Al(1000 Å). The device structure is depicted schematically in FIG. 4. FIG. 6 shows the plot of the external quantum efficiency versus current density for this device, which has a maximum external quantum efficiency of 5.4%.

Example 4

Figure 5:
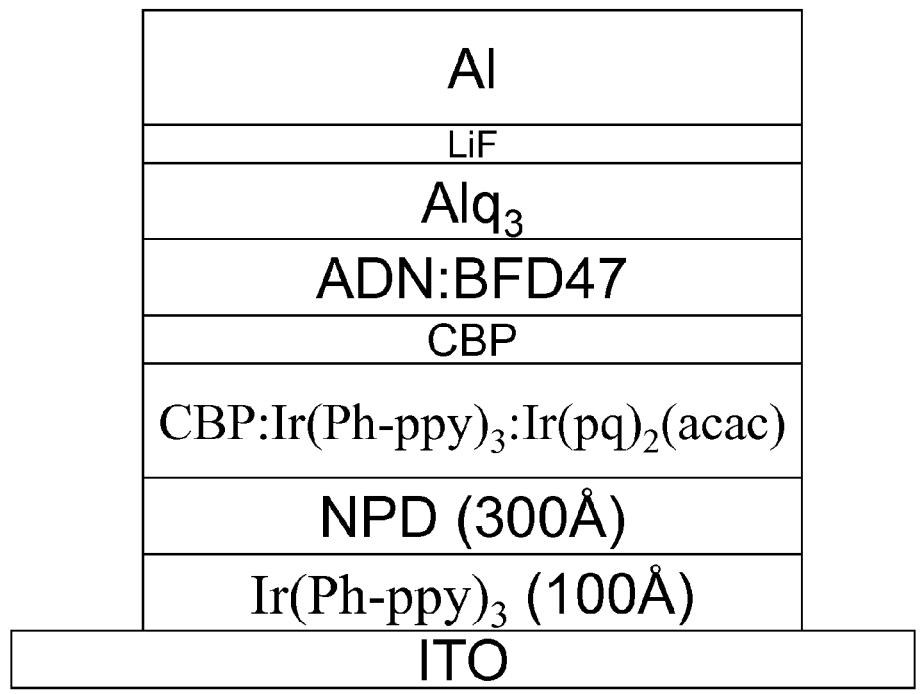
FIG. 5 shows the device structure for the devices of Examples 4-9.
Figure 9:
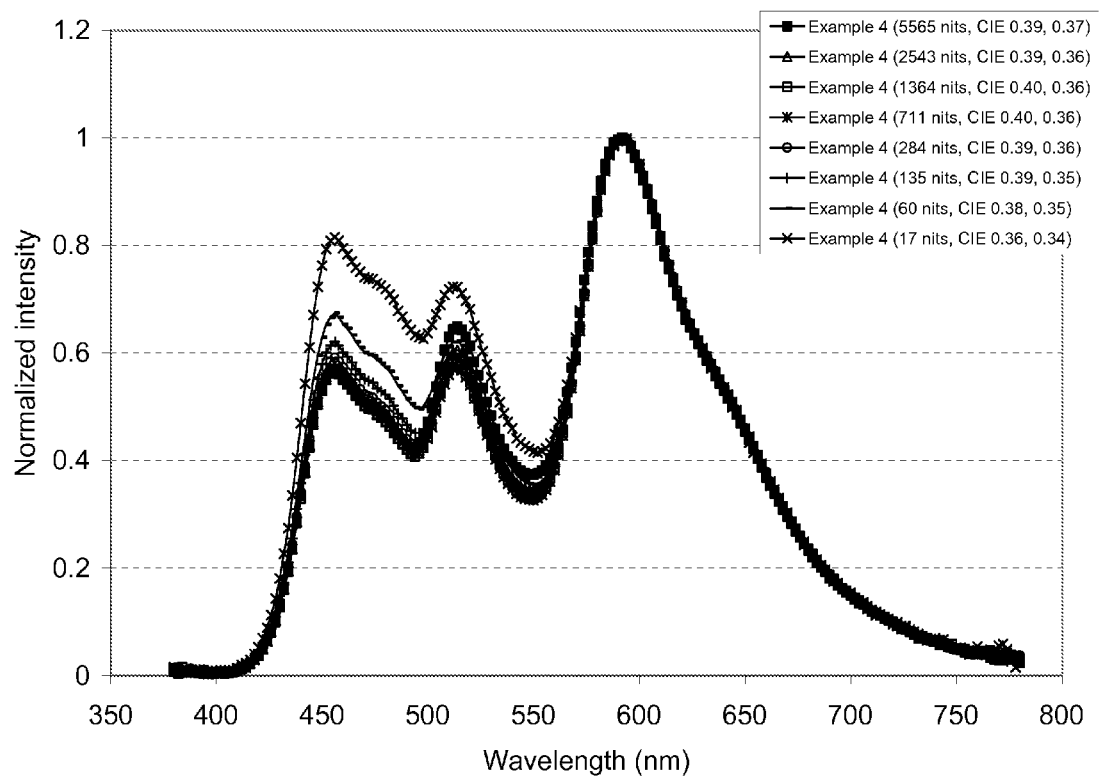
FIG. 9 shows the emission spectra for the device of Example 4 at various current densities.

An OLED was prepared with the structure ITO/Ir(Ph-ppy)$_3$(100 Å)/NPD(300 Å)/CBP:Ir(Ph-ppy)$_3$(6%):Ir(pq)$_2$(acac)(1%)(75 Å)/CBP(15 Å)/ADN:BFD47(300 Å, 6%)/Alq$_3$(300 Å)/LiF(5 Å)/Al(1000 Å). The device structure is depicted schematically in FIG. 5. FIG. 6 shows the plot of the external quantum efficiency versus current density for this device, which has a maximum external quantum efficiency of 6.8%. The plots of the normalized emission spectra at various current densities (brightness) are shown in FIG. 9. As can be seen in FIG. 9, the device shows a high color-stability of the light emission over a wide range of currents or luminances.

Example 5

An OLED was prepared with the structure ITO/Ir(Ph-ppy)$_3$ (100 Å)/NPD(300 Å)/CBP:Ir(Ph-ppy)$_3$(6%):Ir(pq)$_2$(acac)(1%)(50 Å)/CBP(10 Å)/ADN:BFD47(300 Å, 6%)/Alq$_3$(300 Å)/LiF(5 Å)/Al(1000 Å). The device structure is depicted schematically in FIG. 5. FIG. 6 shows the plot of the external quantum efficiency versus current density for this device, which has a maximum external quantum efficiency of 4.7%.

Example 6

An OLED was prepared with the structure ITO/Ir(Ph-ppy)$_3$ (100 Å)/NPD(300 Å)/CBP:Ir(Ph-ppy)$_3$(6%):Ir(pq)$_2$(acaac)(1%)(50 Å)/CBP(15 Å)/ADN:BFD47(300 Å, 6%)/Alq$_3$(300 Å)/LiF(5 Å)/Al(1000 Å). FIG. 6 shows the plot of the external quantum efficiency versus current density for this device, which has a maximum external quantum efficiency of 5.3%.

Example 7

Figure 10:
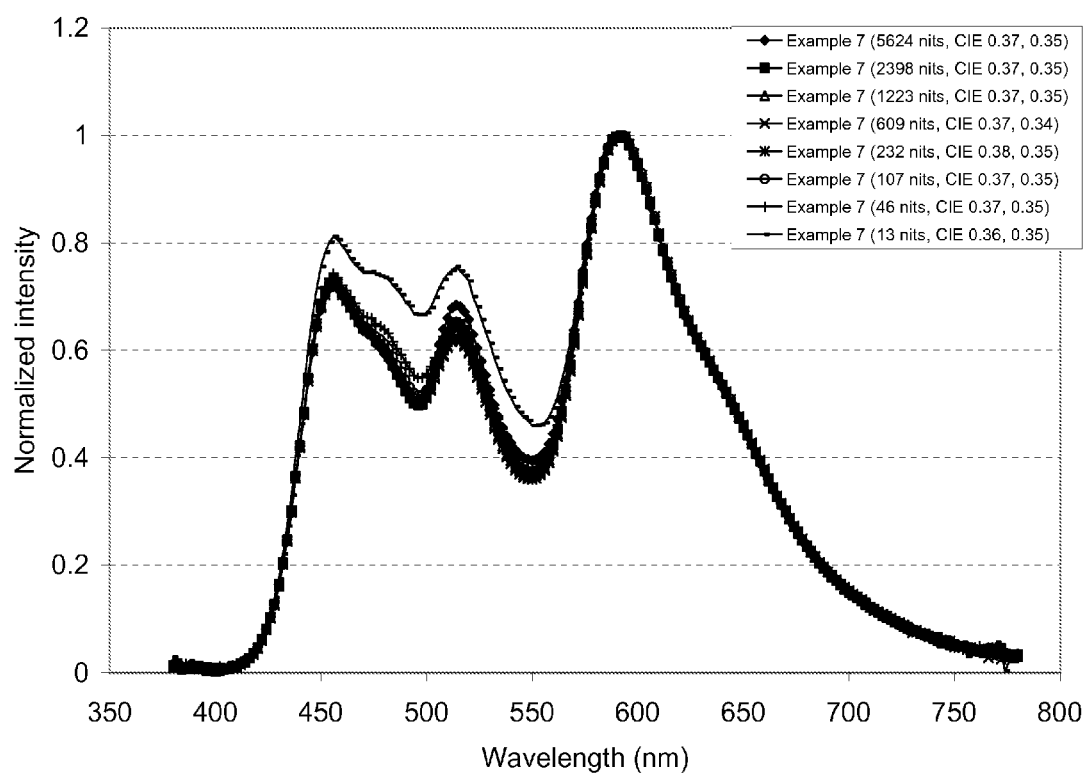
FIG. 10 shows the emission spectra for the device of Example 7 at various current densities.

An OLED was prepared with the structure ITO/Ir(Ph-ppy)$_3$(100 Å)/NPD(300 Å)/CBP:Ir(Ph-ppy)$_3$(12%):Ir(pq)$_2$(acac)(1%)(75 Å)/CBP(15 Å)/ADN:BFD47(300 Å, 6%)/Alq$_3$(300 Å)/LiF(5 Å)/Al(1000 Å). The device structure is depicted schematically in FIG. 5. FIG. 6 shows the plot of the external quantum efficiency versus current density for this device, which has a maximum external quantum efficiency of 6.8%. The plots of the normalized emission spectra at various current densities (brightness) are shown in FIG. 10. As can be seen in FIG. 10, the device shows a high color-stability of the light emission over a wide range of currents or luminances.

Example 8

An OLED was prepared with the structure ITO/Ir(Ph-ppy)$_3$(100 ÅNPD(300 Å)/CBP:Ir(Ph-ppy)$_3$(4%):Ir(pq)$_2$(acac)(1%75 Å)/CBP(15 Å)/ADN:BFD47(300 Å, 6%)/Alq$_3$ (300 Å)/LiF(5 Å)/Al(1000 Å). FIG. 6 shows the plot of the external quantum efficiency versus current density for this device, which has a maximum external quantum efficiency of 6.8%.

Example 9

An OLED was prepared with the structure ITO/Ir(Ph-ppy)$_3$(100 Å)/NPD(300 Å)/CBP: Ir(Ph-ppy)$_3$(18%): Ir(pq)$_2$(acac)(1%)(75 Å)/CBP(15 Å)/ADN:BFD47(300 Å, 6%)/Alq$_3$(300 Å)/LiF(5 Å)/Al(1000 Å). FIG. 6 shows the plot of the external quantum efficiency versus current density for this device, which has a maximum external quantum efficiency of 6.1%.

TABLE 1

| | | measured @ 10 mA/cm² | | | |
|---------|-------|-------|-------|-------|-------|
| Example | CIE x | CIE y | cd/m² | V | EQE % @ 10 mA/cm² | Max EQE % |
| 1 | 0.33 | 0.32 | 900 | 6.7 | 4.7 | 4.7 |
| 2 | 0.35 | 0.34 | 910 | 7.1 | 4.7 | 4.7 |
| 3 | 0.36 | 0.32 | 1035 | 6.8 | 5.4 | 5.4 |
| 4 | 0.40 | 0.36 | 1360 | 7.2 | 6.7 | 6.8 |
| 5 | 0.34 | 0.32 | 900 | 6.5 | 4.6 | 4.7 |
| 6 | 0.35 | 0.34 | 1000 | 6.6 | 5.0 | 5.3 |
| 7 | 0.38 | 0.35 | 1250 | 6.8 | 6.2 | 6.2 |
| 8 | 0.40 | 0.36 | 1230 | 7.1 | 6.1 | 6.8 |
| 9 | 0.39 | 0.35 | 1230 | 7 | 6.1 | 6.1 |

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising an emissive region, wherein the emissive region comprises:
   a first emissive layer comprising a fluorescent blue emitting material as a dopant in a host material;
   a spacer layer;
   a second emissive layer comprising a phosphorescent emitting material as a dopant in a host material, wherein the spacer layer is between the first emissive layer and the second emissive layer, wherein the spacer layer inhibits quenching of the triplet excitons in the second emissive layer, wherein an interface between the spacer layer and one of the first and second emissive layers forming a heterojunction, and wherein the spacer layer comprises a material that has a triplet energy that is higher than the triplet energy of the phosphorescent emitting material,
   wherein one of the following is true:
   (a) the phosphorescent emitting material in the second emissive layer is a phosphorescent green emitting material and the second emissive layer further comprises a phosphorescent red emitting material as a second dopant;
   (b) the phosphorescent emitting material in the second emissive layer is a phosphorescent green emitting material and the emissive region further comprises a third emissive layer on the same side of the spacer layer as the second emissive layer, wherein the third emissive layer comprises a phosphorescent red emitting material as a dopant in a host material; or
   (c) the phosphorescent emitting material in the second emissive layer is a phosphorescent red emitting material and the first emissive layer further comprises a fluorescent green emitting material as a second dopant.

2. The organic light emitting device of claim 1, wherein a combined emission of the emitting materials provides a white emission from the device.

3. The organic light emitting device of claim 1, wherein the blue emitting material is a blue emitting arylpyrene or a blue emitting arylenevinylene compound.

4. The organic light emitting device of claim 1, wherein the device further comprises a separate non-emitting hole transporting layer.

5. The organic light emitting device of claim 1, wherein the device emits light having CIE coordinates of X=0.37±0.07, and Y=0.37±0.07.

6. The organic light emitting device of claim 1, wherein the device has a maximum external quantum efficiency of at least about 5.0%.

7. The organic light emitting device of claim 1, wherein the device has a maximum external quantum efficiency of at least about 6.0%.

8. The organic light emitting device of claim 1, wherein only (a) is true.

9. The organic light emitting device of claim 1, wherein only (b) is true.

10. The organic light emitting device of claim 1, wherein only (c) is true.

11. An emissive region in an organic light emitting device, the emissive region comprising in order:
    a first emissive layer comprising a fluorescent emitting material as a dopant in a host material;
    a spacer layer; and
    a second emissive layer comprising a phosphorescent emitting material as a dopant in a host material, wherein the spacer layer inhibits quenching of the triplet excitons in the second emissive layer,
    wherein an interface between the spacer layer and one of the first and second emissive layers forms a heterojunction, and the spacer layer comprises a material that has a triplet energy that is higher than the triplet energy of the phosphorecent emitting material,
    wherein one of the following is true:
    (a) the phosphorescent emitting material in the second emissive layer is a phosphorescent green emitting material and the second emissive layer further comprises a phosphorescent red emitting material as a second dopant;
    (b) the phosphorescent emitting material in the second emissive layer is a phosphorescent green emitting material and the emissive region further comprises a third emissive layer on the same side of the spacer layer as the second emissive layer, wherein the third emissive layer comprises a phosphorescent red emitting material as a dopant in a host material; or
    (c) the phosphorescent emitting material in the second emissive layer is a phosphorescent red emitting material and the first emissive layer further comprises a fluorescent green emitting material as a second dopant.

12. The emissive region of claim 11, wherein the fluorescent emitting material is a blue emitting material.

13. The emissive region of claim 11, wherein a combined emission of the emitting materials gives a white emission from the device.

14. The emissive region of claim 13, wherein the device emits light having CIE coordinates of X=0.37±0.07, and Y=0.37±0.07.

15. The emissive region of claim 11, wherein the device has a maximum external quantum efficiency of at least about 5.0%.

16. The emissive region of claim 11, wherein the device has a maximum external quantum efficiency of at least about 6.0%.

17. The emissive region of claim 11, wherein only (a) is true.

18. The emissive region of claim 11, wherein only (b) is true.

19. The emissive region of claim 11, wherein only (c) is true.

\* \* \* \* \*